United States Patent
Christensen et al.

(10) Patent No.: US 9,646,712 B1
(45) Date of Patent: *May 9, 2017

(54) IMPLEMENTING EFUSE VISUAL SECURITY OF STORED DATA USING EDRAM

(71) Applicant: International Business Machines Corporation, Armonk, NY (US)

(72) Inventors: Todd A. Christensen, Rochester, MN (US); Karl R. Erickson, Rochester, MN (US); Phil C. Paone, Rochester, MN (US); David P. Paulsen, Inver Grove Heights, MN (US); John E. Sheets, II, Zumbrota, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/064,543

(22) Filed: Mar. 8, 2016

Related U.S. Application Data

(63) Continuation of application No. 14/948,701, filed on Nov. 23, 2015.

(51) Int. Cl.
*G11C 17/18* (2006.01)
*G11C 17/16* (2006.01)
(Continued)

(52) U.S. Cl.
CPC .......... *G11C 17/18* (2013.01); *G11C 11/4096* (2013.01); *G11C 17/16* (2013.01); *H03K 19/21* (2013.01)

(58) Field of Classification Search
CPC ..... G11C 17/18; G11C 11/4096; G11C 17/16; H03K 19/21
See application file for complete search history.

(56) References Cited

U.S. PATENT DOCUMENTS

| | | | | |
|---|---|---|---|---|
| 4,764,959 A | * | 8/1988 | Watanabe | G06F 21/125 713/187 |
| 6,975,730 B1 | * | 12/2005 | Kuroiwa | H04L 9/08 380/247 |

(Continued)

FOREIGN PATENT DOCUMENTS

DE 010353852 A1 6/2004

OTHER PUBLICATIONS

Appendix P—List of IBM Patents or Patent Applications Treated as Related—Mar. 27, 2016.

(Continued)

*Primary Examiner* — J. H. Hur
(74) *Attorney, Agent, or Firm* — Joan Pennington

(57) ABSTRACT

A method and circuit for implementing Electronic Fuse (eFuse) visual security of stored data using embedded dynamic random access memory (EDRAM), and a design structure on which the subject circuit resides are provided. The circuit includes EDRAM and eFuse circuitry having an initial state of a logical 0. The outputs of the eFuse and an EDRAM are connected through an exclusive OR (XOR) gate, enabling EDRAM random data to be known at wafer test and programming of the eFuse to provide any desired logical value out of the XORed data combination.

5 Claims, 4 Drawing Sheets

(51) Int. Cl.
*G11C 11/4096* (2006.01)
*H03K 19/21* (2006.01)

(56) References Cited

U.S. PATENT DOCUMENTS

| | | |
|---|---|---|
| 7,724,022 B1 | 5/2010 | Deskin et al. |
| 8,300,450 B2 | 10/2012 | Christensen et al. |
| 2003/0229799 A1* | 12/2003 | Kaneko .................. G06F 21/76 713/193 |
| 2007/0168676 A1 | 7/2007 | Fayad et al. |
| 2008/0209289 A1 | 8/2008 | Farnsworth et al. |
| 2008/0247547 A1* | 10/2008 | Ikushima ................ H04L 9/065 380/268 |
| 2011/0199809 A1 | 8/2011 | Choi et al. |
| 2011/0209002 A1 | 8/2011 | Chopra |
| 2011/0209289 A1 | 9/2011 | Meyer et al. |
| 2012/0268195 A1 | 10/2012 | Erickson et al. |
| 2013/0173970 A1 | 7/2013 | Kleveland et al. |
| 2014/0078841 A1 | 3/2014 | Chopra |
| 2014/0082453 A1 | 3/2014 | Sikdar et al. |
| 2014/0161259 A1* | 6/2014 | Uchida .............. H04N 21/2347 380/277 |

OTHER PUBLICATIONS

V,Klee et al., "A 0.13 micro meter logic-based embedded DRAM technology with electrical fuses, cu interconnect in SiLK, sub-7ns random access time and its extentsion to the 0.10 um generation", IEEE, IEDM 01 pp. 407-410, 2001.
U.S. Appl. No. 14/932,142, filed Nov. 4, 2015, entitled Multiple FET Non-Volatile Memory with Default Logical State.

* cited by examiner

IMPLEMENTING EFUSE VISUAL SECURITY OF STORED DATA USING EDRAM

This application is a continuation application of Ser. No. 14/948,701 filed Nov. 23, 2015.

FIELD OF THE INVENTION

The present invention relates generally to the data processing field, and more particularly, relates to a method and circuit for implementing Electronic Fuse (eFuse) visual security of stored data using embedded dynamic random access memory (EDRAM), and a design structure on which the subject circuit resides.

DESCRIPTION OF THE RELATED ART

When an eFuse is programmed there is a physical change to the fuse connection. This physical change is large enough to be visually distinguishable from other unblown eFuses. This visual reading of the data stored inside the eFuse macro on a chip will allow hackers to visually determine the sensitive data stored in a chip's eFuse bank. The eFuse stored data can include chip ID, communication security keys, and security booting processes.

Recently a game manufacturer reported that chip pictures of its game had appeared on the internet. These pictures have also been labeled with memory types and sizes and the eFuse macro was one of the memory areas properly labeled. The game manufacturer reported concern that given the ability to see the state of a fuse visually their security data could now be at risk.

A need exists for a circuit having an enhanced mechanism for storing security communication keys or other sensitive data that effectively avoids security breach effectively providing eFuse visual security of stored data.

SUMMARY OF THE INVENTION

Principal aspects of the present invention are to provide a method and circuit for implementing Electronic Fuse (eFuse) visual security of stored data using embedded dynamic random access memory (EDRAM), and a design structure on which the subject circuit resides. Other important aspects of the present invention are to provide such method, circuit and design structure substantially without negative effects and that overcome many of the disadvantages of prior art arrangements.

In brief, a method and circuit for implementing Electronic Fuse (eFuse) visual security of stored data using embedded dynamic random access memory (EDRAM), and a design structure on which the subject circuit resides are provided. The circuit includes EDRAM and eFuse circuitry having an initial state of a logical 0. The outputs of the eFuse and an EDRAM are connected through an exclusive OR (XOR) gate, enabling EDRAM random data to be known at wafer test and programming of the eFuse to provide any logical value out of the XORed data combination.

In accordance with features of the invention, addresses for the EDRAM and eFuse use the same pins connected to the same physical wires, avoiding reads from getting out of synchronization.

In accordance with features of the invention, the eFuse has a busy signal used to indicate that the read has not completed. The eFuse busy signal is used to keep the EDRAM from reading the data inside the cell until the eFuse data is sitting at the XORs. The eFuse busy signal is generated from a state machine that counts the number of cycles it takes for the eFuse to read in order to prevent the EDRAM data from being read without proper filtering by the eFuse, which prevents a hacker access to the EDRAM data without being XORed with or effectively filtered by the eFuse data.

In accordance with features of the invention, once the read address and read order are linked between the EDRAM and eFuse, the EDRAM data can be read during wafer test. This is because the XOR gate will have the eFuse initial state of a zero. Once the test program knows the initial data state of the EDRAM cell the eFuse cell can be programmed to a one or left as a zero to get the desired data at the outputs of the XOR gate. Because an eFuse data input of all zeros is required to properly read the EDRAM data after eFuse programming, the data is never again available to any hacker.

In accordance with features of the invention, because the eFuse starts at an initial state of 0, any EDRAM data can be paired with a programmable eFuse to get the desired data.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing Electronic Fuse (eFuse) visual security of stored data using embedded dynamic random access memory (EDRAM), and a design structure on which the subject circuit resides are provided.

Figure 1:
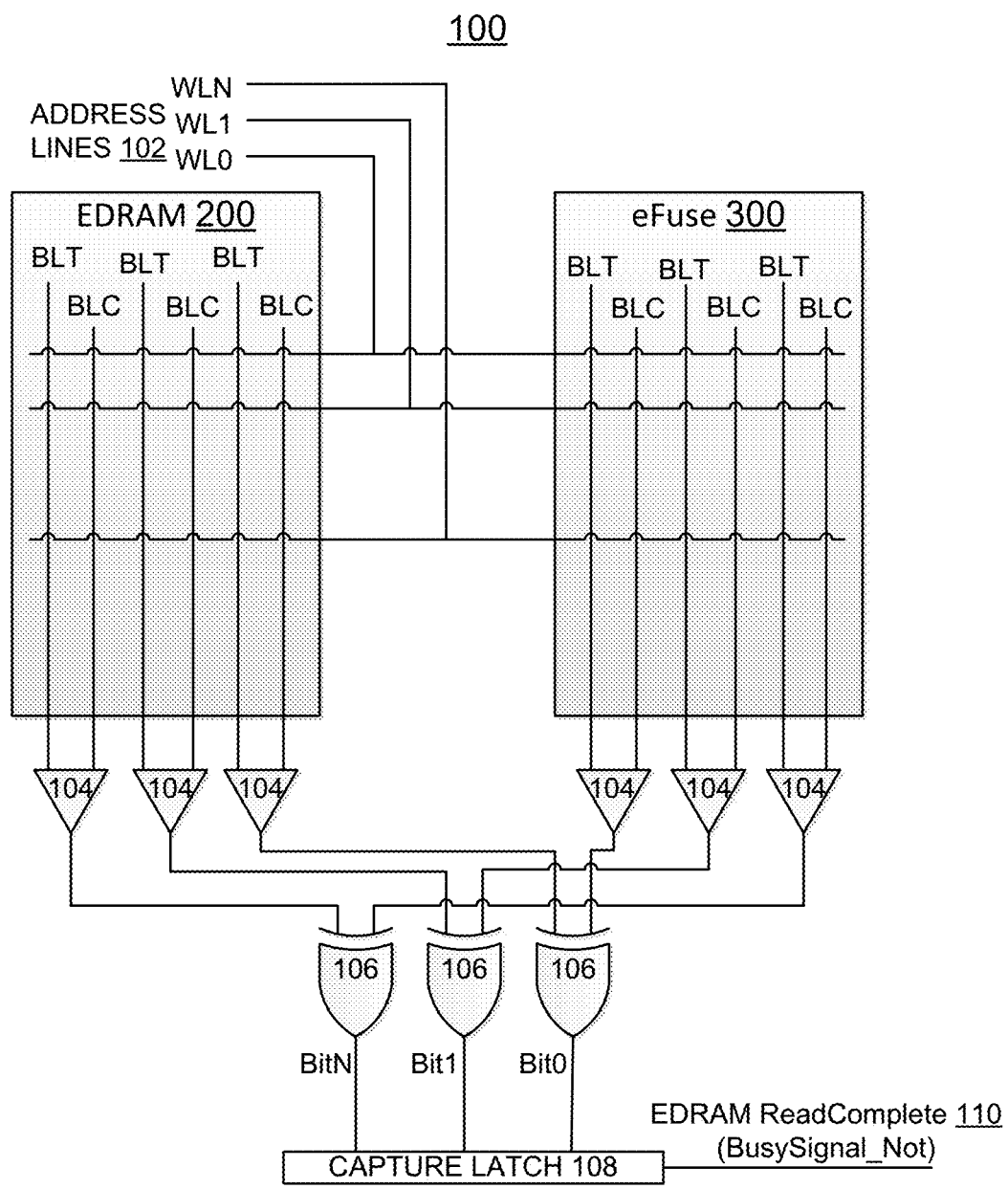
FIG. 1 is a schematic and block diagram representation illustrating an example circuit for implementing Electronic Fuse (eFuse) visual security of stored data using embedded dynamic random access memory (EDRAM) in accordance with preferred embodiments.

Having reference now to the drawings, in FIG. 1, there is shown an example circuit for implementing Electronic Fuse (eFuse) visual security of stored data using embedded dynamic random access memory (EDRAM) generally designated by the reference character 100 in accordance with a preferred embodiments.

Figure 2:
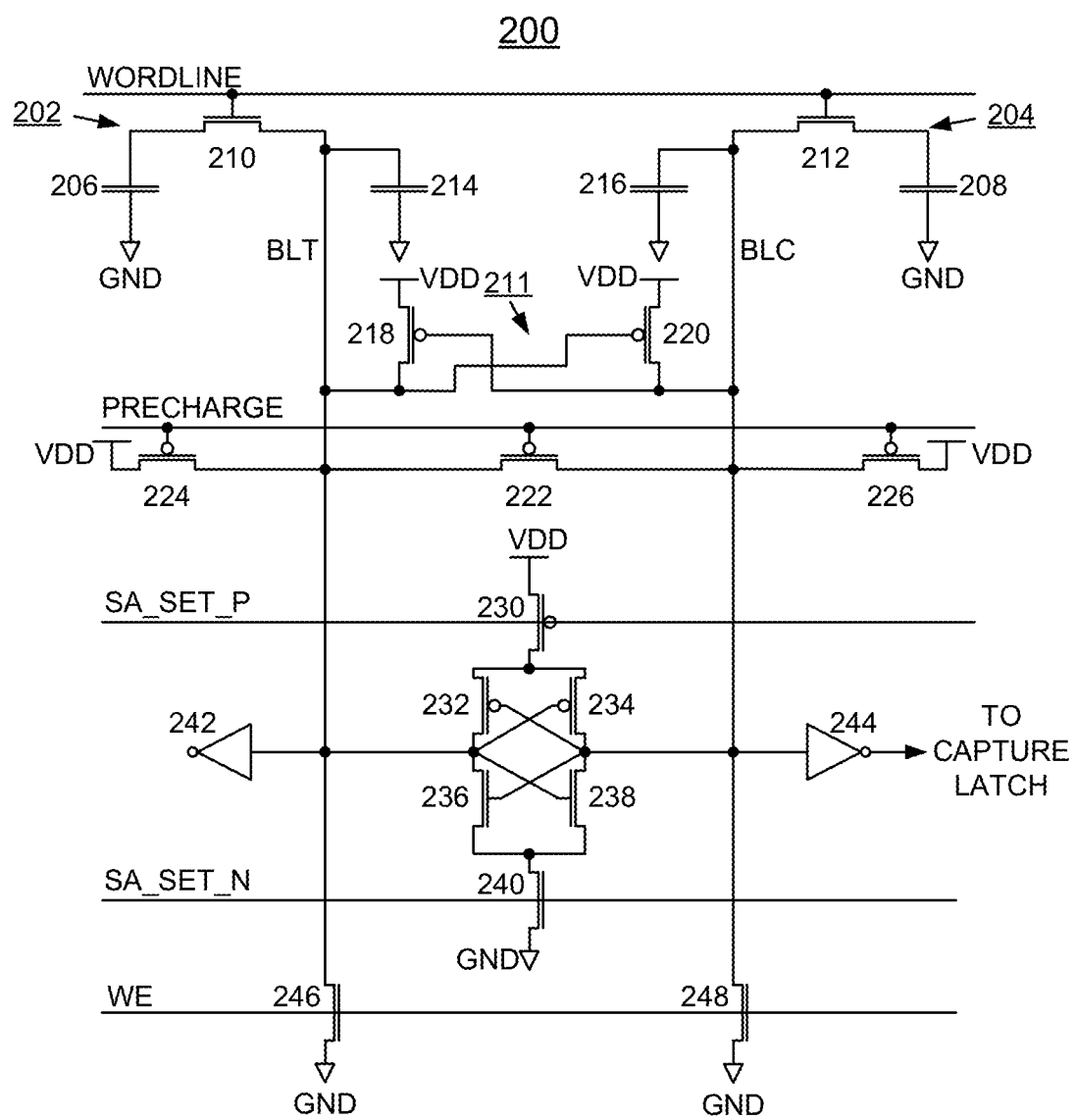
FIG. 2 is a schematic and block diagram representation illustrating example embedded dynamic random access memory (EDRAM) circuitry for implementing Electronic Fuse (eFuse) visual security of stored data using EDRAM in accordance with preferred embodiments.

Referring also to FIG. 2, there is shown example embedded dynamic random access memory (EDRAM) macro or EDRAM circuitry generally designated by the reference character 200 for implementing Electronic Fuse (eFuse) visual security of stored data using EDRAM in accordance with preferred embodiments.

Figure 3:
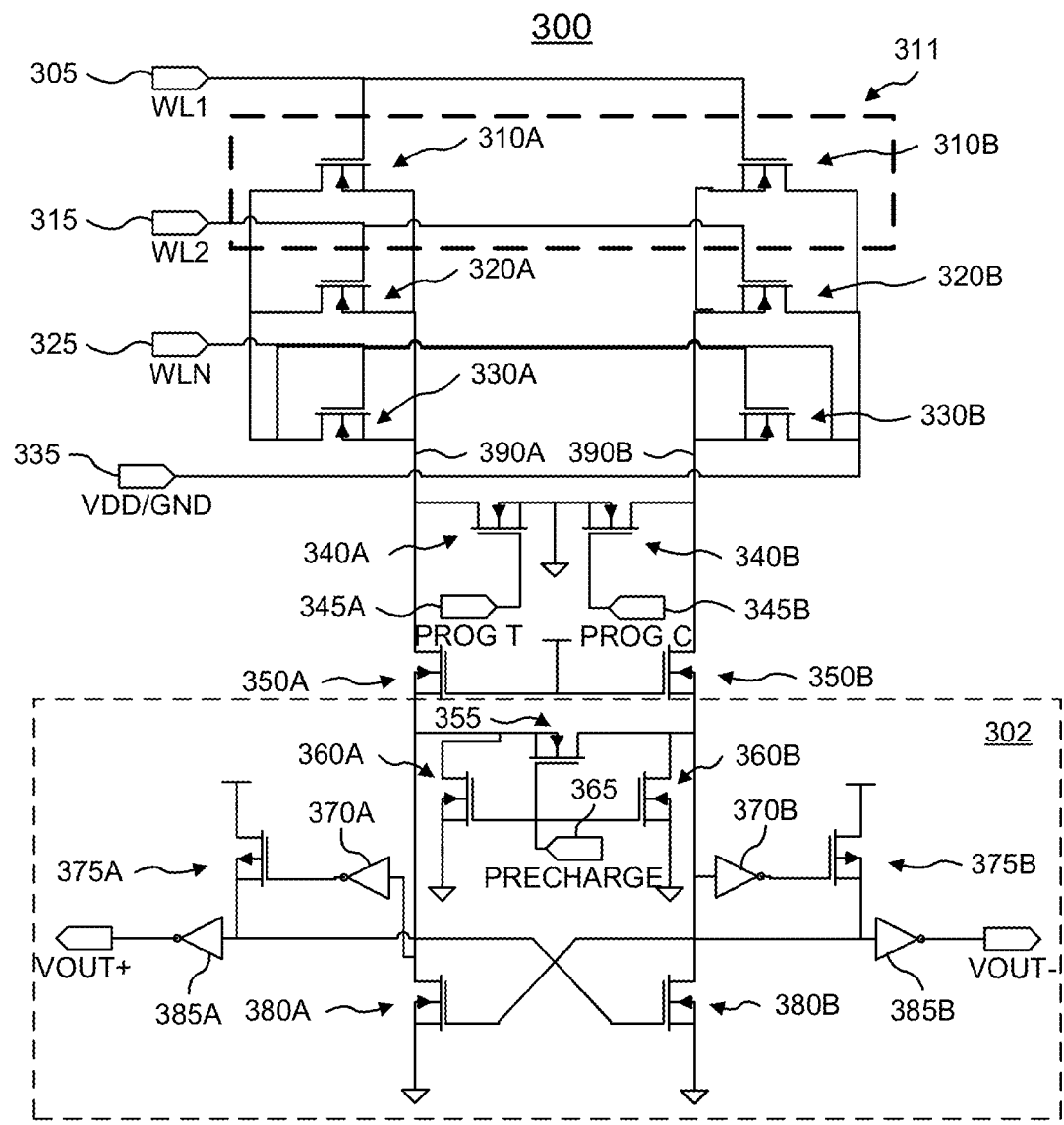
FIG. 3 is a schematic and block diagram representation illustrating example Electronic Fuse (eFuse) circuitry for implementing eFuse visual security of stored data using EDRAM in accordance with preferred embodiments.

Referring also to FIG. 3, there is shown example Electronic Fuse (eFuse) macro or eFuse circuitry generally designated by the reference character 300 for implementing eFuse visual security of stored data using EDRAM in accordance with preferred embodiments.

In accordance with features of the invention, circuit 100 includes the EDRAM 200 and eFuse 300, each including addresses using the same pins connected to the same physical wires or address lines 102, WL0, WL1, WLN, as shown. Using addresses with the same pins connected to the same physical wires for the EDRAM 200 and eFuse 300 keep reads from getting out of synchronization.

In accordance with features of the invention, respective outputs of the eFuse 300 and EDRAM 202 and 204 optionally are applied to a plurality of sense amplifiers 104. The EDRAM 200 includes a sense amplifier, as shown in FIG. 2. The respective outputs of eFuse 300 and EDRAM 200 are connected through a respective exclusive OR (XOR) gate 106. Each of the multiple XOR gates 106 provides a respective XORed bit output, Bit0, Bit1, BitN, as shown. The XORed bit outputs Bit0, Bit1, BitN are applied to a capture latch 108.

In accordance with features of the invention, the eFuse 300 has an initial state of a logical 0. Additionally, the eFuse 300 has a busy signal it uses to indicate that the read has not completed. A control signal to capture latch 108 indicated at line EDRAM ReadComplete 110 is generated from a state machine or other function that counts the number of cycles it takes for the eFuse macro to read in order to prevent the EDRAM data from being read without proper filtering by the eFuse 300. This is critical to prevent a hacker access to the EDRAM data without being first filtered by the eFuse data.

In accordance with features of the invention, using the paired eFuse 300 and EDRAM 200 enables EDRAM random data to be known at wafer test and programming of the eFuse 300 to provide any logical value out of the XORed data combination that is required.

Because the eFuse 300 starts at an initial state of 0 any EDRAM data advantageously is paired with the programmable eFuse to get the desired data, such as shown in the following example:

| Desired Result | 1 | 1 | 0 | 1 | 0 | XOR |
| EDRAM Data | 0 | 1 | 0 | 0 | 1 | Input A |
| Required eFuse data | 0 | 1 | 1 | 0 | 0 | Input B |

In accordance with features of the invention, once the read address and read order are linked between the eFuse 300 and EDRAM 200 the EDRAM data can be read during wafer test. This is because the XOR gate 106 has the eFuse initial state of a zero. Once the test program knows the initial data state of the EDRAM 200 the eFuse 300 can be programmed to a one or left as a zero to get the desired data at the outputs of the XOR gates 106. Because an eFuse data input of all zeros is required to properly read the EDRAM data after eFuse programming, the data will never again be available to any hackers.

U.S. Pat. No. 8,300,450 issued Oct. 30, 2012 to Christensen et al., entitled "IMPLEMENTING PHYSICALLY UNCLONABLE FUNCTION (PUF) UTILIZING EDRAM MEMORY CELL CAPACITANCE VARIATION" discloses a method and an embedded dynamic random access memory (EDRAM) circuit that can be used to implement EDRAM 200 of FIGS. 1 and 2. The subject matter of U.S. Pat. No. 8,300,450 is incorporated herein by reference.

In FIG. 2, example EDRAM 200 includes a plurality of true and complement memory cells receiving a wordline gate input WL1, WL2, WLN, as shown in FIG. 1. As illustrated EDRAM 200 includes a first EDRAM memory cell 202 and a second EDRAM memory cell 204 respectively including a memory cell true storage capacitor 206 and a memory cell complement storage capacitor 208. The memory cell true storage capacitor 206 and the memory cell complement storage capacitor 208 include, for example, trench capacitors or metal insulator metal capacitors (MIM caps). Each memory cell 202, 204 includes a respective control transistor or access N-channel field effect transistor (NFET) 210, 212 controlled by a select signal or wordline, which connects one side of the respective storage capacitor 206, 208 to a data line or bitline. A gate of control or access NFETs 210, 212 is connected to a wordline WL of the cells 202, 204. The NFETs 210, 212 are connected between the respective memory cell storage capacitors 206, 208 and a respective bitline true BLT and bitline complement BLC.

EDRAM circuit 200 includes a pair of P-channel field effect transistors (PFETs) 218, 220, each PFET 218, 220 is connected between a voltage supply line VDD and the respective bitline true BLT and bitline complement BLC. A gate of the respective PFET 218, 220 is connected to the bitline complement BLC and bitline true BLT. EDRAM circuit 200 includes a plurality of P-channel field effect transistors (PFETs) 222, 224, 226. A gate of each of the PFETs 222, 224, 226 is connected to a precharge signal line. PFET 222 is connected between the bitline true BLT and bitline complement BLC. The precharge PFETs 224, 226 are connected between the voltage supply line VDD and the respective bitline true BLT and bitline complement BLC.

EDRAM circuit 200 includes six-device sense amplifier of a plurality of PFETs 230, 232, 234, and a plurality of NFETs 236, 238, 240 connected to the bitline true BLT and bitline complement BLC. A pair of inverters is formed by PFET 232 and NFET 236 and PFET 234 and NFET 238 and connected by PFET 230 to the voltage supply rail VDD and connected by NFET 240 to ground GND. The true bitline BLT is connected to the drain and source connection of inverter PFET 232 and NFET 236 and to the gate input to the inverter PFET 234 and NFET 238. The complement bitline BLC is connected to the drain and source connection of PFET 234 and NFET 238 and to the gate input to the inverter PFET 232 and NFET 236. A gate of the PFET 230 is connected to a sense amplifier set signal SA_SET_P and a gate of NFET 240 connected to a sense amplifier set signal SA_SET_N. A pair of inverters 242, 244 is connected to the bitline true BLT and bitline complement BLC, with inverter 244 providing an input to the capture latch 108 of FIG. 1 coupled by optional sense amplifier 104 and respective XOR gate 106 and inverter 242 provided for balance in the sense amplifier. A respective NFET 246, 248 is connected between the bitline true BLT and bitline complement BLC to ground. A gate of the NFETs 246, 248 is connected to a write enable signal WE.

Referring to FIG. 3, there is shown example eFuse 300 that includes a sensing circuit 302 and a plurality of non-volatile memory (NVM) elements field effect transistors (FETs) defining respective true and complement memory cells 310A, 310B, 320A, 320B, 330A, and 330B receiving a respective wordline gate input WL1, WL2, WLN, as shown in FIG. 1, and having the same pins connected to the same physical wires as EDRAM 200. The eFuse 300 starts at an initial state of 0, any EDRAM data can be paired with the programmable eFuse 300 to get the desired data.

There is a wordline signal for each of the eFuse NVM elements. Wordline WL1, 305 is shared by FETs 310A, 310B. Wordline WL2, 315 is shared by FETs 320A, 320B. Wordline WLN, 325 is shared by FETs 330A, 330B. To program one of the FETs of a NVM element, a high voltage may be applied to the FET through the corresponding wordline and supply voltage 335. A respective bitline true 390A and bitline complement 390B are connected to control FETs 340A, 340B respectively receiving a gate input PROG T, 345A and PROG C, 345B. The respective control FETs 340A, 340B is activated to bring respective bitline true 390A, and bitline complement 390B.

FETs 350A, 350B may be configured to protect sense circuit 302 from the high voltage produced during the programming of eFuse NVM elements. To prepare for sensing a NVM element, bitline true 390A, and bitline complement 390B may be precharged to ground and balanced. Input PRECHARGE 365 may be brought high to activate NFET 355, which balances bitline true 390A, and bitline complement 390B, and to activate NFETs 360A, 360B to bring bitline true 390A, and bitline complement 390B to ground. Supply voltage 335 is applied and the wordline applied to the applicable NVM element rises.

NFETs 380A, 380B may be configured to pull the connected bitline to ground when turned on by the other bitline. NFET 380A is configured to pull bitline 390A toward ground in response to the increase in voltage of bitline 390B. Similarly, NFET 380B is configured to pull bitline 390B toward ground in response to the increase in voltage of bitline 390A. Inverters 370A, 370B and PFETs 375A, 375B may be configured to pull the faster rising bitline to full VDD rail. Inverters 370A, 370B may be configured to change output from high to low once the input bitline reaches a specified voltage. The low output may turn on the corresponding PFET 375A, or PFET 375B, bringing the bitline to full VDD rail. Inverters 385A, 385B may provide output from sense circuit 302. Inverter 385A may provide the main output for sense circuit 302. For example, a high output from inverter 385A may represent a logical one and a low output may represent a logical zero.

Figure 4:
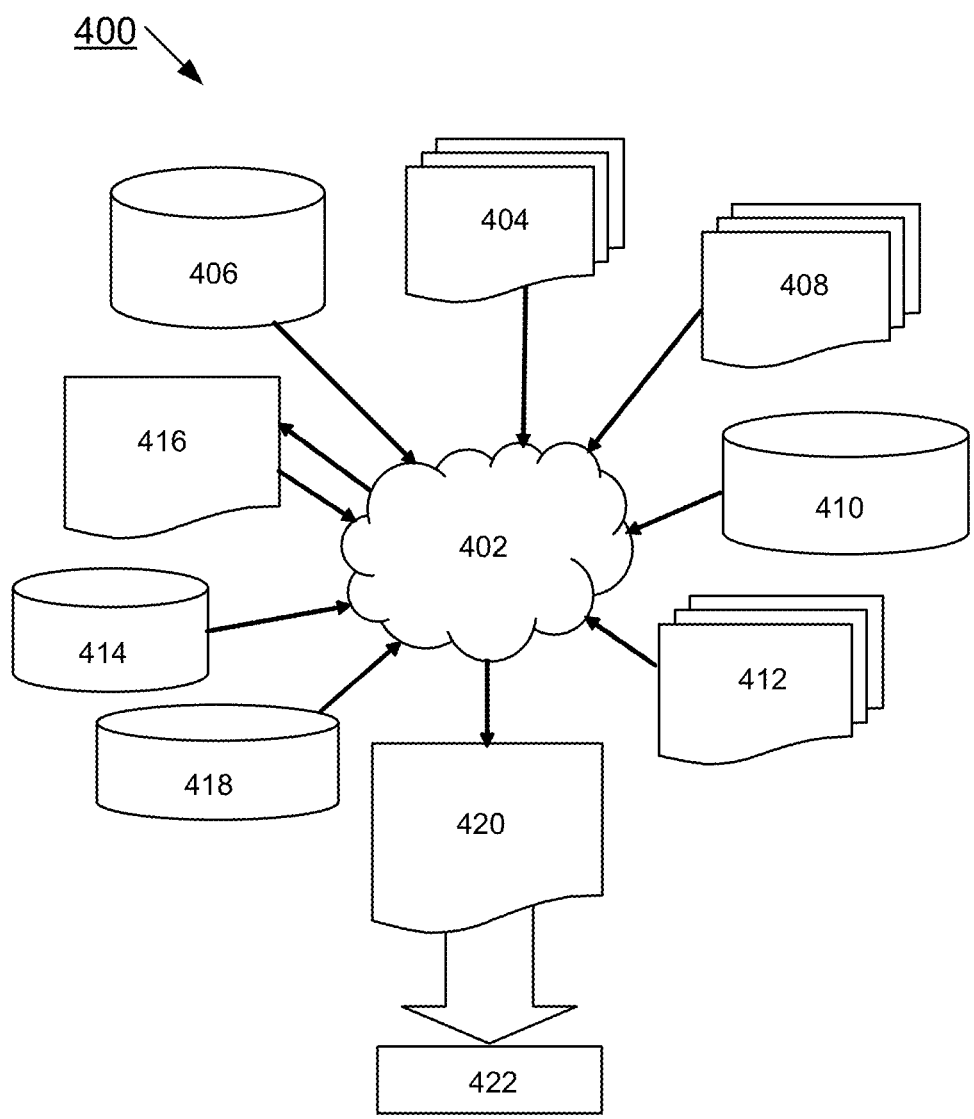
FIG. 4 is a flow diagram of a design process used in semiconductor design, manufacturing, and/or test.

FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuits 100, 200, 300 in the form of schematics or HDL, a hardware-description language, for example, Verilog, VHDL, C, and the like. Design structure 402 may be contained on one or more machine readable medium. For example, design structure 402 may be a text file or a graphical representation of circuits 100, 200, 300. Design process 404 preferably synthesizes, or translates, circuits 100, 200, 400 into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuit.

Design process 404 may include using a variety of inputs; for example, inputs from library elements 408 which may house a set of commonly used elements, circuits, and devices, including models, layouts, and symbolic representations, for a given manufacturing technology, such as different technology nodes, 22 nm, 32 nm, 45 nm, 90 nm, and the like, design specifications 410, characterization data 412, verification data 414, design rules 416, and test data files 418, which may include test patterns and other testing information. Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates an embodiment of the invention as shown in FIGS. 1, 2, and 3, along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2, and 3. Design structure 420 may then proceed to a stage 422 where, for example, design structure 320 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing Electronic Fuse (eFuse) visual security of stored data using embedded dynamic random access memory (EDRAM), said method comprising:

providing an EDRAM;

providing an eFuse having an initial state of a logical 0, said EDRAM and said eFuse having a same bit count; and providing an exclusive OR (XOR) gate receiving respective outputs of said eFuse and said EDRAM, said XOR gate providing an output data combination enabling EDRAM random data to be known at wafer test, and enabling said eFuse to be programmed to provide any logical value out of the output data combination.

2. The method as recited in claim 1 includes providing each address input for said EDRAM and said eFuse using a same pin connected to a same physical wire, avoiding reads from getting out of synchronization.

3. The method as recited in claim 2 wherein said eFuse has a busy signal used to indicate that the read has not completed, and includes using said eFuse busy signal to provide a control signal for reading said XOR gate.

4. The method as recited in claim 1 includes providing a capture latch receiving respective outputs of said XOR gate.

5. The method as recited in claim 1 includes enabling data read of said EDRAM during wafer test, responsive to linking a read address and a read order between said EDRAM and said eFuse.

\* \* \* \* \*